United States Patent
Shin

(10) Patent No.: US 7,248,512 B2
(45) Date of Patent: Jul. 24, 2007

(54) SEMICONDUCTOR MEMORY DEVICE HAVING CONTROLLER WITH IMPROVED CURRENT CONSUMPTION

(75) Inventor: Beom Ju Shin, Icheon-si (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 2 days.

(21) Appl. No.: 11/157,834

(22) Filed: Jun. 22, 2005

(65) Prior Publication Data

US 2006/0098502 A1    May 11, 2006

(30) Foreign Application Priority Data

Nov. 8, 2004    (KR) .................. 10-2004-0090254

(51) Int. Cl.
*G11C 7/00*    (2006.01)
(52) U.S. Cl. ............. 365/194; 365/230.03; 365/230.06
(58) Field of Classification Search ............... 365/194, 365/193, 191, 233, 230.03, 230.06, 189.05
See application file for complete search history.

(56) References Cited

U.S. PATENT DOCUMENTS

| | | | |
|---|---|---|---|
| 5,493,241 A * | 2/1996 | Landry et al. ............. 326/105 |
| 5,568,445 A | 10/1996 | Park et al. | |
| 5,691,955 A | 11/1997 | Yamauchi | |
| 5,966,724 A | 10/1999 | Ryan | |
| 6,343,040 B2 * | 1/2002 | Bae ............................. 365/203 |
| 6,356,507 B1 * | 3/2002 | Kaku et al. .................. 365/233 |
| 2003/0179613 A1 * | 9/2003 | Iwamoto ..................... 365/194 |
| 2005/0232044 A1 * | 10/2005 | Akiyama et al. ........... 365/207 |

FOREIGN PATENT DOCUMENTS

| | | |
|---|---|---|
| JP | 9171681 | 6/1997 |
| JP | 10106288 | 4/1998 |
| JP | 10275467 | 10/1998 |
| JP | 11096760 | 4/1999 |

* cited by examiner

*Primary Examiner*—Gene N. Auduong
(74) *Attorney, Agent, or Firm*—Lowe Hauptman & Berner, LLP

(57) ABSTRACT

A semiconductor memory device wherein, in order to control the current consumed in a column address counter and latch block in a read operation, delay units disposed in the column address counter and latch block perform a shifting operation according to a signal CASP6, which is enabled in the write and read operations, and a signal WT6RD5Z, which is enabled in the write operation and disabled in the read operation. Accordingly, unnecessary current consumed in the read operation can be reduced.

19 Claims, 6 Drawing Sheets

SEMICONDUCTOR MEMORY DEVICE HAVING CONTROLLER WITH IMPROVED CURRENT CONSUMPTION

BACKGROUND

1. Field of the Invention

The present invention relates to a semiconductor memory device in which current consumption is reduced in a read operation, and more specifically, to a semiconductor memory device in which the current consumed in a column address counter and a latch in the read operation can be reduced.

2. Discussion of Related Art

FIG. 1 is a functional block diagram illustrating the configuration of a DDR SDRAM in the prior art.

A control logic 10 includes a command decoder 20 and a mode register 30. A clock enable signal CKEn, a clock signal CK, a clock bar signal /CK, a chip select signal /CSn, a write enable signal /WE, a column address strobe signal /CAS and a row address strobe signal /RAS are input to the control logic 10. Further, block select addresses BA0, BA1 and addresses A0 to A13 are input to the control logic 10 through an address register 40. The command decoder 20 generates read, write and precharge commands, etc. according to an input signal. The mode register 30 generates a CAS latency value and a burst length value according to an input address. A row address multiplexer 60 generates a row address according to an input address and also generates the row address according to an address outputted from a refresh counter 50.

A bank row address latch and decoder 90 outputs a bank select signal for selecting a memory bank, and is controlled by means of a bank control logic 70. A column decoder 130 generates a column address according to input addresses. A column address counter and latch 80 generates a plurality of column addresses for a burst operation if an address is received, and provides the generated column addresses to the column decoder 130. The column address counter and latch 80 also generates a signal col0 that divides even and odd regions of a memory bank. A bank memory array 100 is composed of a plurality of memory banks. The memory banks are selected according to a bank select signal. Each of the memory banks consists of a plurality of cells, which are selected according to a row address and a column address. A I/O gating DM mask logic 120 controls the input of data to the memory banks. Data write is controlled according to a data mask signal.

The data of the memory banks are amplified in a sense amplifier 110 and then latched in a read latch 140 via the I/O gating DM mask logic 120. The data latched in the read latch 140 is transferred to a driver 170 according to the operation of a multiplexer 150. The data is synchronized to DQS data from a DQS generator 180 and then outputted to an external chipset.

The data from the external chipset is input to a receiver 200 in synchronism with external DQS data. The data from the receiver 200 is stored in an input register 210 and input to the write FIFO and driver 190. The data from the write FIFO and driver 190 is written into a corresponding cell through the I/O gating DM mask logic 120 and the sense amplifier 110 according to a mask signal. Meanwhile, a clock CLK is applied to the driver 170 through a delay lock loop (DLL) 160.

The DDR SDRAM constructed above needs a column address counter because there exists a burst operation in the read and write operations. The column address counter operates in accordance with a timing at which the sense amplifier reads or writes data. That is, in the read operation, the column address counter operates at a clock to which a read command is applied. In the write operation, it operates after 2*tCK since a write command is applied. This is because 1*tCK is needed to align internal data, as can be seen from FIG. 2. In the DDR SDRAM, write data are applied later than the write command. It is also required that data latched at the rising edge of DQS be aligned at the falling edge of DQS, as shown in FIG. 2. In other words, a data D0 is latched at a first rising edge of DQS, and the data D0 is aligned while a data D1 is latched at a first falling edge of DQS. In the similar manner, a data D2 is latched at a second rising edge of DQS, and the data D2 is aligned while a data D3 is latched at a second falling edge of DQS. Accordingly, the fastest time point where data can be written in the sense amplifier is after 2*tCK from write. Therefore, in the write operation, all of the write command, the bank address and the column address have to be delayed as much as 2*tCK. A circuit for such delay is provided in the column address counter and latch 80. In the prior art, such a delay circuit is driven even in the read operation. Thus, lots of power is consumed.

SUMMARY OF THE INVENTION

Accordingly, the present invention has been made in view of the above problems, and it is an object of the present invention to provide a semiconductor memory device in which the current consumed in a column address counter at the time of a read operation can be reduced.

To achieve the above object, according to the present invention, there is provided a semiconductor memory device including delay circuits for delaying a bank address and a column address in a write operation, comprising a controller for disabling the operation of the delay circuits in a read operation.

DETAILED DESCRIPTION OF PREFERRED EMBODIMENTS

Now, the preferred embodiments according to the present invention will be described with reference to the accompanying drawings.

Figure 1:
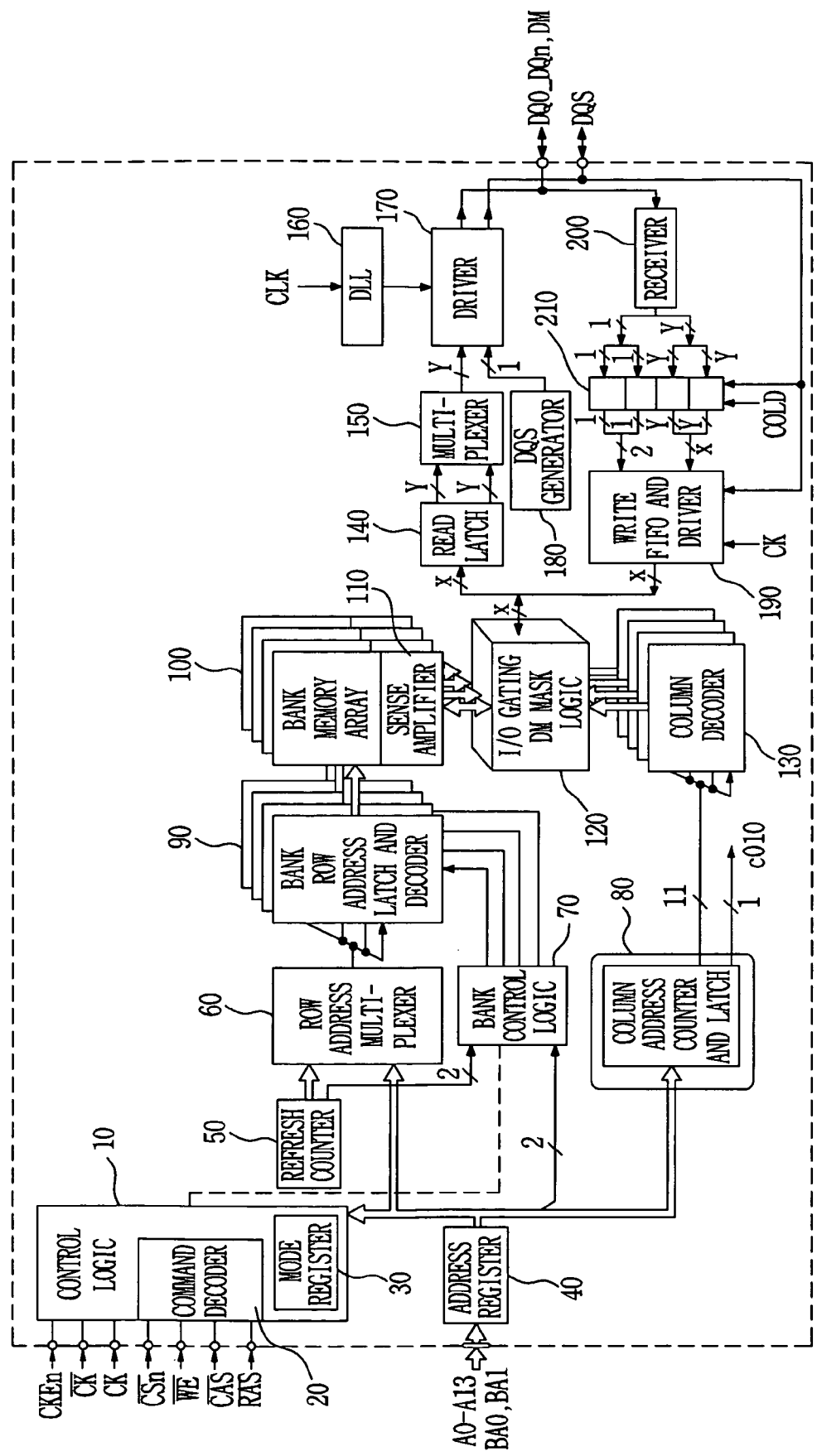
FIG. 1 is a functional block diagram illustrating the configuration of a DDR SDRAM in the prior art.
Figure 2:
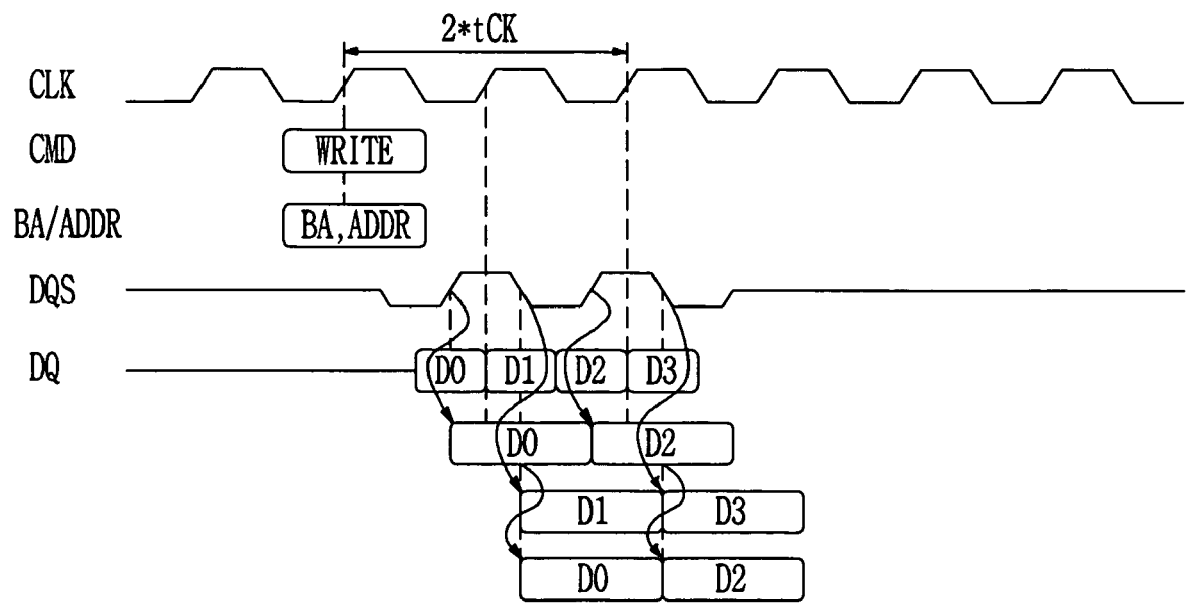
FIG. 2 a write timing diagram of FIG. 1.
Figure 3:
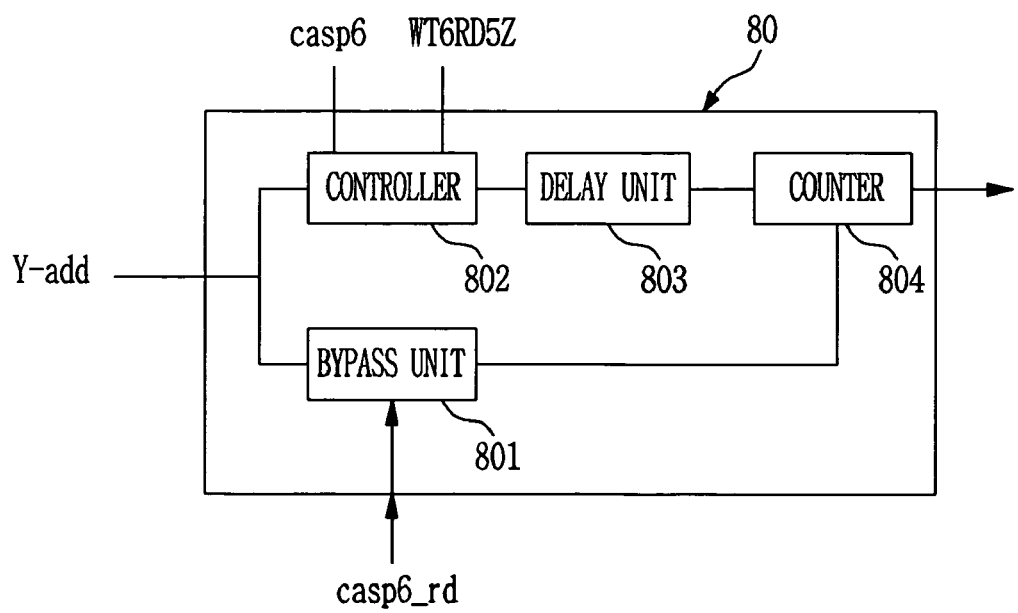
FIG. 3 is a block diagram illustrating some of a column address counter and a latch according to an embodiment of the present invention.

FIG. 3 is a schematic block diagram of a column address counter and a latch according to an embodiment of the present invention.

In the read operation, a control signal casp6_rd is enabled, and a column address Y-add is thus provided to a counter

804 through a bypass unit 801. A controller 802 generates a control signal according to a signal casp6, which is enabled in the write and read operations, and a signal WT6RD5Z, which is enabled in the write operation and disabled in the read operation. The column address Y-add can be provided to a delay unit 803 or block according to an output signal of the controller 802. The delay unit 803 delays the received column address Y-add by 2*tCK and provides the delayed column address to the counter 804.

That is, in the present embodiment, the delay unit 803 is not driven in the read operation but only in the write operation.

Figure 4:
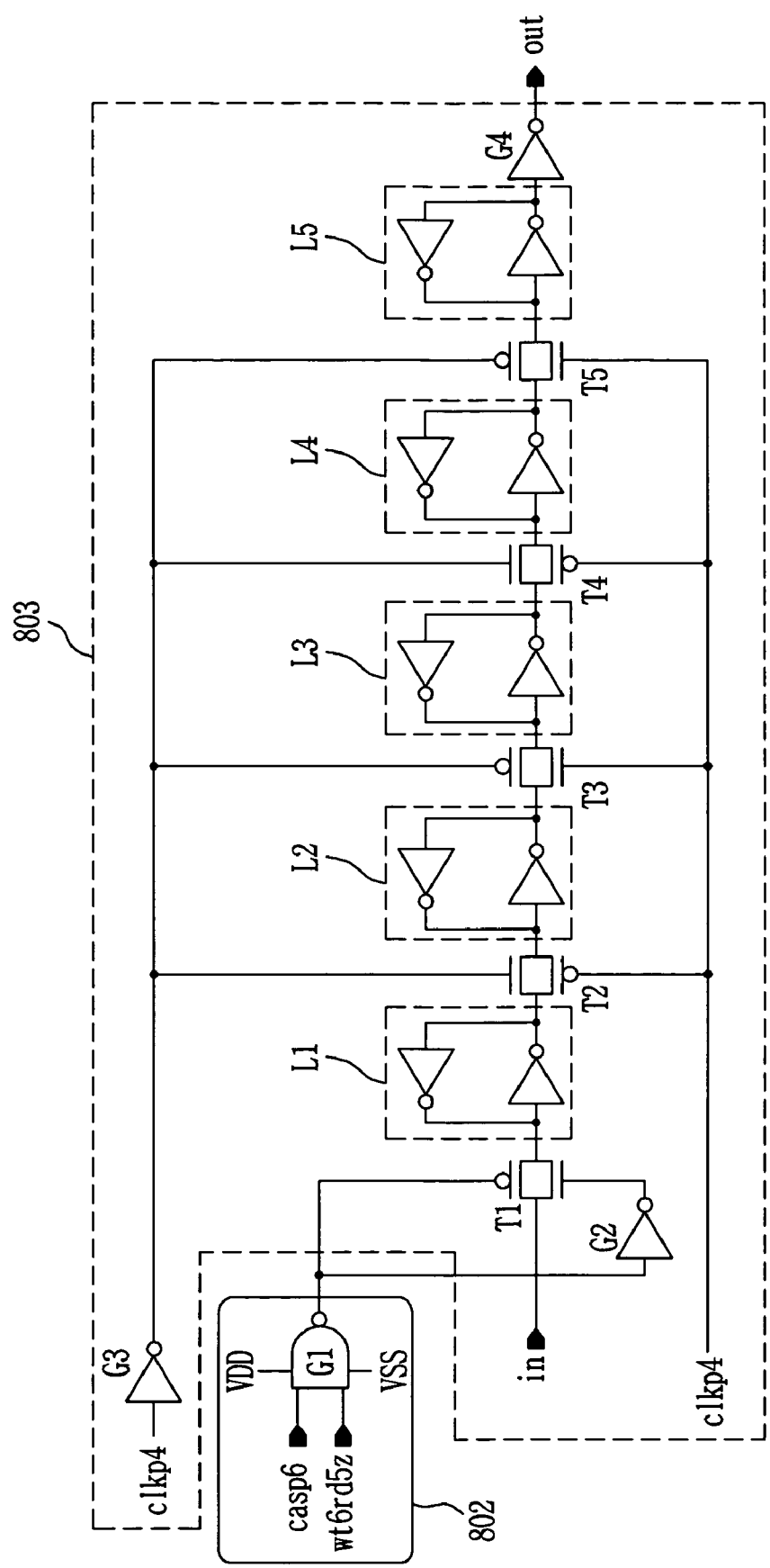
FIG. 4 is a detailed circuit diagram of a delay unit shown in FIG. 3.

FIG. 4 is a detailed circuit diagram of the controller and the delay unit shown in FIG. 3. The operation of each of the controller and the delay unit will now be described in detail with reference to FIG. 5.

The controller 802 includes a NAND gate G1. The NAND gate G1 receives a signal CASP6, which is enabled according to a write command WRITE or a read command READ shown in FIG. 5, and a signal WT6RD5Z, which is enabled according to the write command and disabled according to the read command, as inputs. If these two signals CASP6 and WT6RD5Z are at a logic HIGH state, the output of the NAND gate G1 becomes a logic LOW state. If the output of the NAND gate G1 becomes a logic LOW state, the output of an inverter G2 becomes a logic HIGH state, and a transfer gate T1 is thus turned on. Accordingly, a received column address is provided to a latch L1 through the transfer gate T1. Meanwhile, transfer gates T2 to T5 are turned according to a signal clkp4, which is enabled at the rising edge of a clock CLK and a signal inverted by an inverter G3. The column address through the transfer gate T1 is output to an output terminal out via latches L1 to L5 and an inverter G4. That is, the delay unit 803 delays an input column address as much as 2*tck only in the write operation, but does not perform a shifting operation in the read operation. As a result, it is possible to reduce current consumption that much.

Generally, a memory device such as a DDR DRAM is composed of a plurality of column address counter and latches. At this time, the controller constructed above can be installed in each block.

Figure 6:
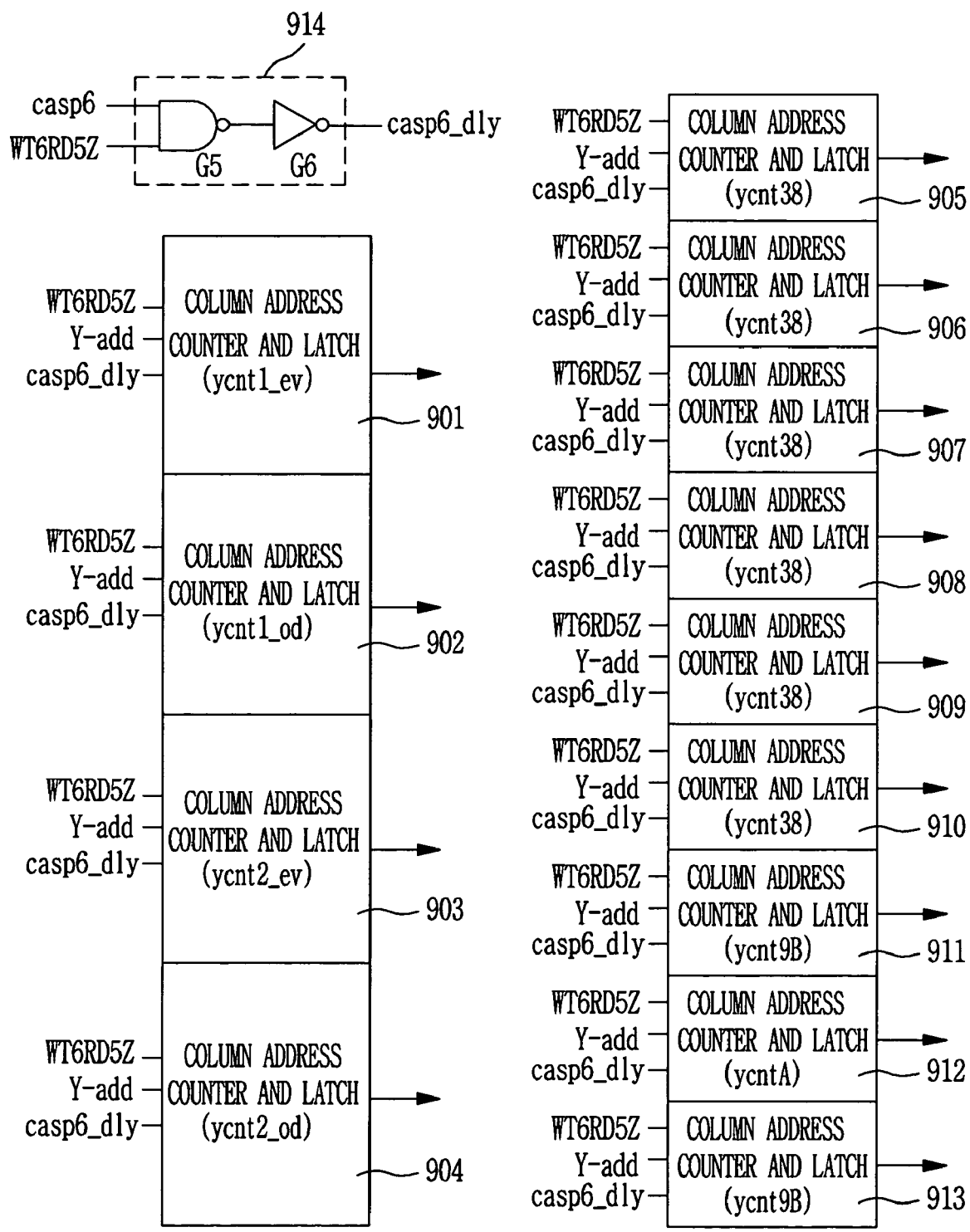
FIG. 6 is a block diagram of a column address counter and a latch according to another embodiment of the present invention.

FIG. 6 is a block diagram of column address counter and latches according to another embodiment of the present invention.

For instance, in the case of a 256 Mb DDR SDRAM, the number of column address counter and latches is 13. Therefore, in the read operation, a total of 13 delay units in each column address counter and latch unnecessarily operate. In order to solve this problem, in the embodiment of FIG. 4, the controller is additionally installed every column address counter and latch. In the embodiment of FIG. 6, however, one controller is used to control the 13 column address counter and latch blocks.

As shown in FIG. 6, 13 column address counters and latches 901 to 913 are controlled according to outputs casp6_dly of a controller 914. The controller 914 consists of a NAND gate G5 and an inverter G6, and receives the signal CASP6, which is enabled according to the write command WRITE or the read command READ shown in FIG. 5, and the signal WT6RD5Z, which is enabled according to the write command and disabled according to the read command, as inputs. If both the signals CASP6 and WT6RD5Z are at a logic HIGH state, the output of the NAND gate G5 becomes a logic LOW state. If the output of the NAND gate G5 becomes a logic LOW state, the output casp_dly of the inverter G6 becomes a logic HIGH state. The output casp_dly of the inverter G6 is provided to the column address counter and latches 901 to 903. Accordingly, a shifting operation of a delay unit, which is included in each of the column address counter and latches 901 to 903 and delays the column address as much as 2*tck in the read operation is blocked. It is thus possible to reduce current consumption to that extent.

Figure 7:
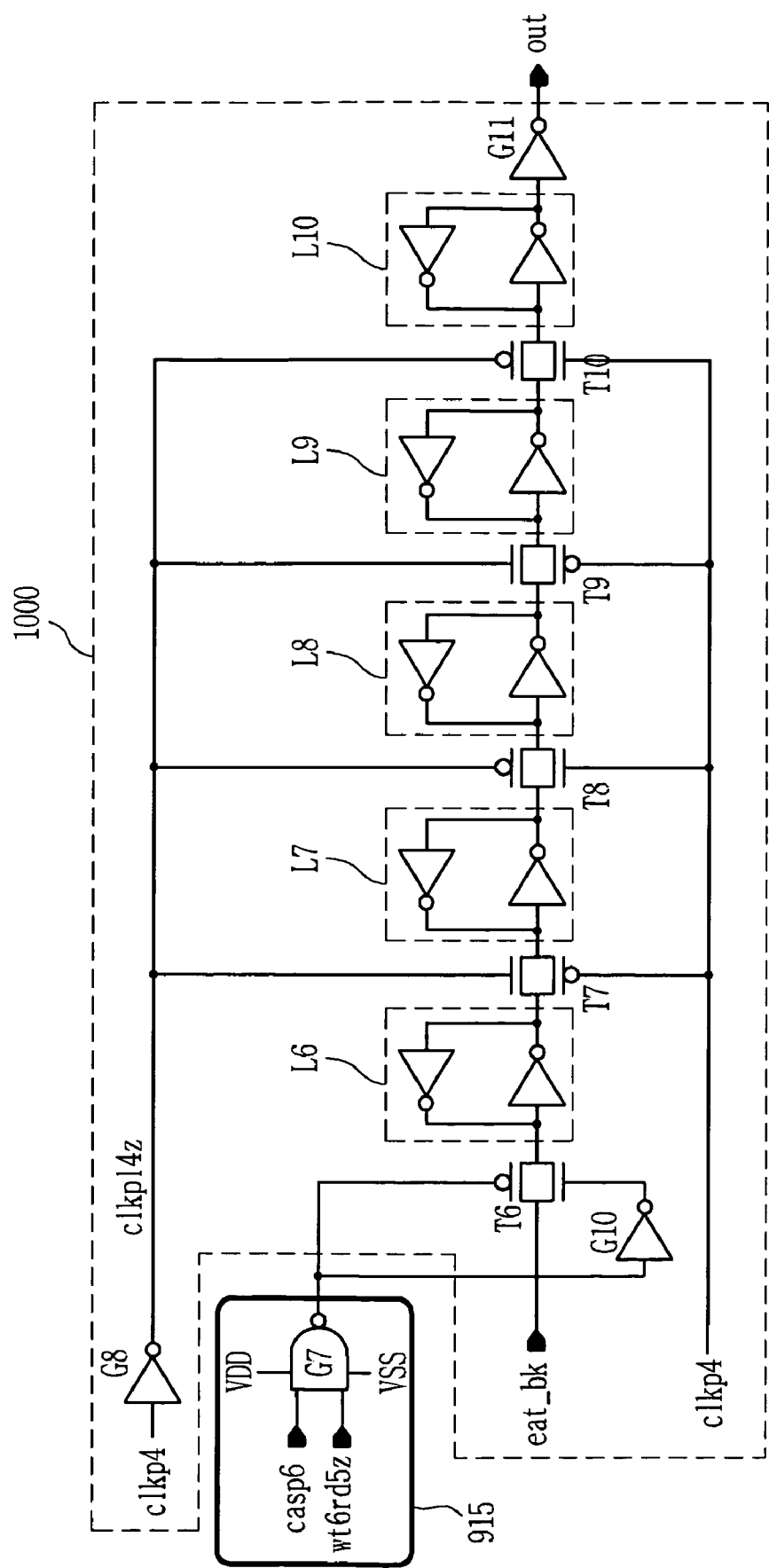
FIG. 7 is a circuit diagram for explaining another embodiment of the present invention.

FIG. 7 is a circuit diagram for explaining another embodiment of the present invention.

In case of a DDR SDRAM, in the write operation, the bank address as well as the column address has to be delayed as much as 2*tck. However, in the same manner as the column address counter and latch block, if the shift operation of the delay unit for delaying the bank address in the read operation is blocked, current consumption can be saved.

Figure 5:
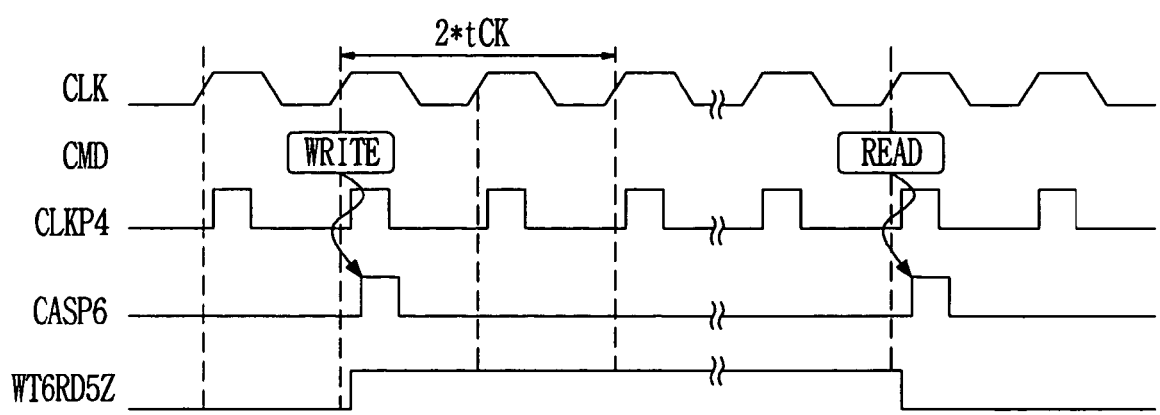
FIG. 5 is a timing diagram for explaining the operation of FIG. 3.

A controller 915 is composed of a NAND gate G7, and receives the signal CASP6, which is enabled according to the write command WRITE or the read command READ shown in FIG. 5, and the signal WT6RD5Z, which is enabled according to the write command and disabled according to the read command, as inputs. If both the signals CASP6 and WT6RD5Z are at a logic HIGH state, the output of the NAND gate G7 becomes a logic LOW state. If the output of the NAND gate G7 becomes a logic LOW state, the output of an inverter G10 becomes a logic HIGH state, and a transfer gate T6 is thus turned on. Meanwhile, transfer gates T7 to T10 are turned on according to the signal clkp4, which is enabled at the rising edge of the clock CLK and a signal clkpl4z inverted by an inverter G8. Thus, a latched bank address eat_bk is delayed through the transfer gates T6 to T10 and latches L6 to L10 and outputs to an output terminal out via an inverter G11. That is, a delay unit 1000 delays an inputted bank address as much as 2*tck only in the write operation, but does not perform a shift operation in the read operation. Accordingly, current consumption can be saved.

A 256 Mb DDR SDRAM needs four circuits as shown in FIG. 7 since it is 4 banks. Accordingly, if the shift operation of these circuits is blocked in the read operation, current consumption can be saved to that extent.

As described above, according to the present invention, unnecessary current consumed in the read operation can be reduced. Therefore, the present invention is advantageous in a low-power operation of a DDR SDRAM.

Although the foregoing description has been made with reference to embodiments, it is to be understood that changes and modifications of the present invention may be made by the ordinary skilled in the art without departing from the spirit and scope of the present invention and appended claims.

What is claimed is:

1. A semiconductor memory device including delay circuits for delaying a bank address and a column address in a write operation, the semiconductor memory device comprising: a controller for disabling the operation of the delay circuits in a read operation.

2. The semiconductor memory device as claimed in claim 1, wherein the controller operates according to a signal, which is enabled when read and write commands are applied, and a signal, which is enabled in the write operation.

3. The semiconductor memory device as claimed in claim 1, wherein the controller comprises a NAND gate element.

4. The semiconductor memory device as claimed in claim 1, wherein the controller has the same number as that of a column address counter and latch including the delay circuits for delaying the column address.

5. The semiconductor memory device as claimed in claim 1, wherein the controller is one in number, and the delay circuits disposed in a plurality of column address counter and latches are controlled at the same time according to an output of the controller.

6. A memory device comprising: at least one delay circuit for delaying a bank address and a column address in a write operation; and a controller for disabling the operation of the delay circuits in a read operation.

7. The device as claimed in claim 6, wherein the controller operates according to a signal, which is enabled when read and write commands are applied, and a signal, which is enabled in the write operation.

8. The device as claimed in claim 6, wherein the controller comprises a NAND gate element.

9. The device as claimed in claim 6, wherein the controller has the same number as that of a column address counter and latch including the delay circuits for delaying the column address.

10. The device as claimed in claim 6, wherein the controller is one in number, and the plurality of the delay circuits disposed in a plurality of column address counter and latches are controlled at the same time according to an output of the controller.

11. A memory device comprising: a plurality of delay delay circuits for delaying a bank address and a column address in a write operation, the semiconductor memory device comprising: a controller for disabling the operation of the delay circuits in a read operation wherein the plurality of the delay circuits are disposed in a plurality of column address counter and latches are controlled at the same time according to an output of the controller.

12. The semiconductor memory device as claimed in claim 11, wherein the controller operates according to a signal, which is enabled when read and write commands are applied, and a signal, which is enabled in the write operation.

13. The semiconductor memory device as claimed in claim 11, wherein the controller comprises a NAND gate element.

14. The semiconductor memory device as claimed in claim 11, wherein the controller has the same number as that of a column address counter and latch including the delay circuits for delaying the column address.

15. A semiconductor device comprising: a memory device, comprising: at least one delay circuit for delaying a bank address and a column address in a write operation; and a controller for disabling the operation of the delay circuits in a read operation.

16. The device as claimed in claim 15, wherein the controller operates according to a signal, which is enabled when read and write commands are applied, and a signal, which is enabled in the write operation.

17. The device as claimed in claim 15, wherein the controller comprises a NAND gate element.

18. The device as claimed in claim 15, wherein the controller has the same number as that of a column address counter and latch including the delay circuits for delaying the column address.

19. The device as claimed in claim 15, wherein the controller is one in number, and the plurality of the delay circuits disposed in a plurality of column address counter and latches are controlled at the same time according to an output of the controller.

* * * * *